United States Patent
Mintz et al.

[11] Patent Number: 5,849,136
[45] Date of Patent: Dec. 15, 1998

[54] HIGH FREQUENCY SEMICONDUCTOR WAFER PROCESSING APPARATUS AND METHOD

[75] Inventors: Donald M. Mintz, Sunnyvale; Hiroji Hanawa, Santa Clara; Sasson Somekh; Dan Maydan, both of Los Altos Hills; Kenneth S. Collins, San Jose, all of Calif.

[73] Assignee: Applied Materials, Inc., Santa Clara, Calif.

[21] Appl. No.: 754,833

[22] Filed: Nov. 22, 1996

Related U.S. Application Data

[63] Continuation of Ser. No. 433,002, May 3, 1995, abandoned, which is a continuation of Ser. No. 984,234, Feb. 1, 1993, abandoned, which is a division of Ser. No. 774,127, Oct. 11, 1992, Pat. No. 5,223,457.

[51] Int. Cl.$^6$ ........................................ H05H 1/00
[52] U.S. Cl. .................. 156/345; 315/111.21; 118/723 E
[58] Field of Search ................ 156/345; 118/723 E; 315/111.21; 204/298.34, 298.01

[56] References Cited

U.S. PATENT DOCUMENTS

| | | |
|---|---|---|
| 3,763,031 | 10/1973 | Slow ........................................ 204/298 |
| 3,860,507 | 1/1975 | Vossen, Jr. . |
| 4,340,456 | 7/1982 | Robinson ............................ 204/192 E |
| 4,373,581 | 2/1983 | Toellner . |
| 4,375,051 | 2/1983 | Theall . |
| 4,438,368 | 3/1984 | Abe ............................................ 315/39 |
| 4,496,448 | 1/1985 | Tai et al. . |
| 4,513,022 | 4/1985 | Jansen et al. . |
| 4,521,286 | 6/1985 | Horwitz . |
| 4,526,643 | 7/1985 | Okano et al. . |
| 4,572,759 | 2/1986 | Benzing . |
| 4,585,668 | 4/1986 | Asmussen et al. . |
| 4,617,079 | 10/1986 | Tracy ........................................ 156/345 |
| 4,626,312 | 12/1986 | Tracy ........................................ 156/345 |
| 4,673,589 | 6/1987 | Standley . |
| 4,756,810 | 7/1988 | Lamont, Jr. et al. . |
| 4,785,962 | 11/1988 | Toshima . |
| 4,808,258 | 2/1989 | Otsuto et al. . |
| 4,842,707 | 6/1989 | Kinoshita ................................ 204/298 |
| 4,863,549 | 9/1989 | Grünwald . |
| 4,887,005 | 12/1989 | Rough ................................ 315/111.21 |
| 4,906,898 | 3/1990 | Moisan . |
| 4,915,979 | 4/1990 | Ishida et al. . |
| 4,951,009 | 8/1990 | Collins . |
| 5,016,564 | 5/1991 | Nakamura ............................... 118/723 |
| 5,032,202 | 7/1991 | Tsai ........................................ 156/345 |
| 5,032,205 | 7/1991 | Hershkowitz .......................... 156/345 |
| 5,078,851 | 1/1992 | Nishihata ........................... 204/298.34 |

FOREIGN PATENT DOCUMENTS

| | | |
|---|---|---|
| 0058820 | 1/1982 | European Pat. Off. . |
| 0277460 | 12/1987 | European Pat. Off. . |
| 0334638 | 3/1989 | European Pat. Off. . |
| 0346131 | 6/1989 | European Pat. Off. . |
| 3336652 | 10/1983 | Germany . |

OTHER PUBLICATIONS

Professor Tadahiro Ohmi, "From Alchemy to Science: Technological Chanlenges" from a handout given at a talk on Sep. 1, 1989.

S.M. Sze, "VLSI Technology", pp. 107–108; McGraw–Hill; 1983.

*Primary Examiner*—Thi Dang
*Attorney, Agent, or Firm*—Birgit E. Morris; Donald Verplancken

[57] ABSTRACT

A plasma process apparatus capable of operation significantly above 13.56 MHz can produce reduced self-bias voltage of the powered electrode to enable softer processes that do not damage thin layers that are increasingly becoming common in high speed and high density integrated circuits. A nonconventional match network is used to enable elimination of reflections at these higher frequencies. Automatic control of match network components enables the rf frequency to be adjusted to ignite the plasma and then to operate at a variable frequency selected to minimize process time without significant damage to the integrated circuit.

11 Claims, 3 Drawing Sheets

HIGH FREQUENCY SEMICONDUCTOR WAFER PROCESSING APPARATUS AND METHOD

This application is a continuation, of application Ser. No. 08/433,002 filed May 3, 1995, now abandoned, which is a continuation of U.S. application Ser. No. 07/984,234 filed Feb. 1, 1993, now abandoned, which is a division, of application Ser. No. 07/774,127, filed Oct. 11, 1992, now U.S. Pat. No. 5,223,457.

In the figures, the first digit of a reference numeral will indicate the first figure in which is presented the element indicated by that reference numeral.

BACKGROUND OF THE INVENTION

This invention relates in general to semiconductor wafer processing apparatus and relates more particularly to the use of a plasma apparatus for wafer cleaning, wafer deposition and wafer etching. For example, the plasma etching of wafers is attractive because it can be anisotropic, can be chemically selective, can produce etch under conditions far from thermodynamic equilibrium, utilizes a reduced amount of etchant chemicals compared to wet etch processes and produces a significantly reduced amount of waste products. The reduction of etchant chemicals and waste products produces a cost savings. The anisotropic etch enables the production of substantially vertical sidewalls which is important in present day processes in which the depth of etch and feature size and spacing are all comparable. The ability to choose etch chemicals and process parameters to produce chemical selectivity of the etch enables these choices to be made to etch the desired material without substantially etching other features of the integrated circuits being produced. Choices of process parameters that produce process conditions far from thermodynamic equilibrium can be used to lower process temperature, thereby avoiding high temperatures that can deleteriously affect the integrated circuits under fabrication.

In FIG. 1 is shown a plasma reactor 10. This reactor includes an aluminum wall 11 that encloses a plasma reactor chamber 12. Wall 11 is grounded and functions as one of the plasma electrodes. Gases are supplied to chamber 12 from a gas source 13 and are exhausted by an exhaust system 14 that actively pumps gases out of the reactor to maintain a low pressure suitable for a plasma process. An rf power supply 15 provides power to a second (powered) electrode 16 to generate a plasma within chamber 12. Wafers 17 are transferred into and out of reactor chamber 12 through a port such as slit valve 18.

A plasma consists of two qualitatively different regions: the substantially neutral, conductive plasma body 19 and a boundary layer 110 called the plasma sheath. The plasma body consists of substantially equal densities of negative and positive charged particles as well as radicals and stable neutral particles. The plasma sheath is an electron deficient, poorly conductive region in which the electric field strength is large. The plasma sheath forms between the plasma body and any interface such as the walls and electrodes of the plasma reactor chamber and the rf electrodes.

Semiconductor process plasmas are produced by a radio frequency (rf) field at 13.56 MHz that couples energy into free electrons within the chamber, imparting sufficient energy to many of these electrons that ions can be produced through collisions of these electrons with gas molecules. Typically, the walls of the reactor chamber are metal (though often coated with thin insulating layers) so that they can function as one of the rf electrodes. When the walls do not function as one of the electrodes, they still affect the process by confining the plasma and by contributing capacitive coupling to the plasma reactor.

The 13.56 MHz frequency is substantially universally utilized in plasma reactors because this frequency is an ISM (Industry, Scientific, Medical) standard frequency for which the government mandated radiation limits are less stringent than at non-ISM frequencies, particularly those within the communication bands. This substantial universal use of 13.56 MHz is further encouraged by the large amount of equipment available at that frequency because of this ISM standard. Other ISM standard frequncies are at 27.12 and 40.68 MHz, which are first and second order harmonics of the 13.56 MHz ISM standard frequency. A further advantage of the 13.56 MHz frequency is that, since the lowest two order harmonics of this frequency are also ISM standard frequencies, equipment utilizing 13.56 MHz is less likely to exceed allowable limits at harmonics of the fundamental frequency of such equipment.

When the powered rf electrode is capacitively coupled to the rf power source, a dc self bias $V_{dc}$ of this electrode results. The magnitude of this self bias $V_{dc}$ is a function of the ion density and electron temperature within the plasma. A negative self-bias dc voltage $V_{dc}$ of the powered electrode on the order of several hundreds of volts is commonly produced (see, for example, J. Coburn and E. Kay, Positive-ion bombardment of substrates in rf diode glow discharge sputtering, J. Appl. Phys., 43, p. 4965 (1972). This self bias dc voltage $V_{dc}$ is useful in producing a high energy flux of positive ions against the powered electrode. Therefore, in a plasma etching process, a wafer 17 to be etched is positioned on or slightly above the powered electrode 16 so that this flux of positive ions is incident substantially perpendicular to the top surface of the wafer, thereby producing substantially vertical etching of unprotected regions of the wafer.

These high voltages enable etch rates that are required for the etch process to be commercially attractive. Because of the susceptibility of the small (submicron) geometry devices available today to damage by a small amount of particulates, integrated circuit (IC) process systems are available that enable several IC process steps to be executed before reexposing the wafer to ambient atmosphere (see, for example, the multichamber system illustrated in U.S. Pat. No. 4,785,962 entitled Vacuum Chamber Slit Valve, issued to Masato Toshina on Nov. 22, 1988). This small geometry has also produced a trend toward single wafer process steps (as opposed to multiwafer processing steps that are common in larger geometry devices) so that processing can be sufficiently uniform over the entire wafer that these small geometry features can be produced throughout the wafer.

Because the wafer throughput of the system is limited to the throughput of the slowest of the series of process steps within such a system, it is important that none of these sequential steps take significantly longer than the other steps in the process or else such slow step will serve as a bottleneck to system throughput. Presently, typical system throughput is on the order of 60 wafers per hours For example, the fundamental etch prior to metal 2 deposition is performed at a rate equivalent to a 250 Angstroms per minute silicon dioxide etch rate. This permits the removal of approximately 70 Angstroms of aluminum oxide in contacts to aluminum metal 1 in approximately 40 seconds using a nonselective argon-only process. These etch conditions are used routinely in wafer fabrication and produce a 1500–1600 volt self bias at the powered electrode.

Transistor speed specifications and high device densities in the most modem MOS integrated circuits have required the use of shallow junctions and thin gate oxides. Unfortunately, such IC structures are sensitive to ion bombardment by high energy ions such as those utilized with conventional 13.56 MHz plasma etch apparatus. Therefore, it is advantageous in such IC processing to reduce the self-bias voltage of the powered electrode to less than 500 volts negative self-bias using a nonselective argon-only process. Because wafer damage decreases with decreasing self-bias voltage, it would be even more advantageous to operate at self-bias voltages closer to 300 V. Unfortunately, at 13.56 MHz, this reduction of self-bias results in a much slower etch rate, which thereby significantly degrades process throughput.

One solution has been to enhance the etch rate by use of magnets that produce containment fields that trap ions within the vicinity of the wafer, thereby increasing the ion density at the wafer. The magnetic field confines energetic ions and electrons by forcing them to spiral along helical orbits about the magnetic field lines. Such increased ion density at the wafer produces a concomitant increase in etch rate without increasing the self bias potential, thereby enabling throughputs on the order of 60 wafers per hour without damaging the wafers. In effect, the etch rate is preserved by increasing the current level to counter the decreased voltage drop across the plasma sheath at the wafer. Unfortunately, nonuniforiities of the magnetic field of such "magnetically enhanced" plasma etching systems exhibit a decreased uniformity of etch rate over the surface of the wafer.

To improve uniformity over the surface of the wafer, in one such system the wafer is rotated about an axis that is perpendicular to and centered over the surface of the powered electrode. This produces at the wafer surface a time-averaged field that has cylindrical symmetry and an improved uniformity over the wafer and therefore produces increased etch uniformity over the surface of the wafer. However, this rotation produces within the plasma chamber undesirable mechanical motion that can produce particulates and increase contamination. Alternatively, a rotating magnetic field can be produced by use of two magnetic coils driven by currents that are ninety degrees out of phase. Unfortunately, the controls and power supplies for this scheme are relatively expensive and the etch uniformity is still not as good as in a plasma etch apparatus that does not include such magnets.

Another solution to enhance the rate of plasma processing of wafers is the recently developed technique of electron cyclotron resonance. This technique has application to wafer cleaning, etching and deposition processes. In this technique, a plasma is produced by use of a microwave source and a magnetic containment structure. Unfortunately, this technique, when applied to etching or chemical vapor deposition, exhibits poor radial uniformity and low throughput. In addition, it requires expensive hardware that includes: (1) a complex vacuum pumping system; (2) a microwave power supply that must produce microwave power at an extremely accurate frequency and power level; (3) a large magnetic containment system that may include large electromagnets; and (4) an rf or dc power supply connected to the wafer electrode.

SUMMARY OF THE INVENTION

In a conventional plasma reactor, an igniter electrode produces, within a low pressure gas, high energy electrons that have enough energy to ionize within the reactor chamber atoms and molecules struck by these high energy electrons. This results in a cascade of electrons that produce a plasma consisting of electrons, ions, radicals and stable neutral particles. The plasma is then maintained by a powered electrode of voltage lower than that of the igniter electrode. Sufficient rf power is coupled into the plasma to maintain a desired ion concentration, typically on the order of $10^8$–$10^{11}$ cm$^{-3}$. Typically the frequency of the rf power is in the range from 10 kHz to 30 MHz, but the most common frequency is 13.56 MHz because this is high enough to produce reasonable ion concentrations and is an ISM (industry, scientific, medical) standard frequency that does not interfere with telecommunications.

Because the electrons are on the order of thousands to hundreds of thousands of times lighter than the plasma ions, the electrons experience a proportionately greater acceleration than the ions and therefore acquire kinetic energies that are significantly greater than those acquired by the ions. The effect of this is that the energy from the rf field is strongly coupled into electron kinetic energy and is only very weakly coupled into ion kinetic energy. These high energy electrons are also referred to as high temperature electrons. As a further result of this large mass difference between the electrons and the ions, collisions between the high energy electrons and the ions does not transfer much of the electron energy to the ions. The effect of this is that the electrons acquire a temperature that is typically on the order of 1–5 ev even though the other particles in the plasma remain substantially at the temperature of the walls of the plasma reactor chamber (on the order of 0.03 ev) or up to a few hundred degrees Centigrade hotter.

Because the electrons are much more mobile than the ions, they initially strike the walls of the reactor chamber at a greater rate than do the ions. The effect of this is that the plasma body becomes slightly electron deficient while the boundary layer sheath becomes substantially electron deficient. This also produces a positively charged layer at the interface between the plasma body and the plasma sheath. This net positive charge of the plasma body and boundary layer results in a plasma body electrical potential $V_p$ (usually called the "plasma potential") on the order of several times the electron mean kinetic energy divided by the electron charge. The potential in the bulk of the plasma is nearly constant while the largest part of the potential variation is across the sheath. In an rf plasma, this sheath potential variation is also dependent on various parameters including the area of the reactor chamber wall, the area of the powered electrode, the pressure in the reactor chamber and the rf power input.

In accordance with the illustrated preferred embodiment, a plasma apparatus is presented that operates at frequencies higher than the 13.56 MHz frequency utilized in conventional plasma apparatus. Useful frequencies for plasma processing have been found to range from 30 to 200 MHz. These processes include wafer cleaning, chemical vapor deposition and plasma etching. The frequency that is selected is dependent on which of these processes is being utilized which in turn determines the required choice of plasma density and ion bombardment energy.

In the case of a nonreactive etch process, the lower frequency limit is controlled by the maximum self bias voltage that can be used without damaging the integrated circuit under fabrication. The upper frequency limit is controlled by the minimum self bias voltage (about 150 volts for a nonreactive etch process and 50 volts for a reactive ion etch process) that produces sufficient energy to etch the wafer. As a practical matter, when this etch process is used in a serial wafer fabrication system, this upper limit is further reduced by the requirement that such etching be achievable within a period that is short enough that this etching step does not create a bottleneck to fabrication throughput. This range of frequencies has required modification of the match network that prevents reflections of rf power at the transition from the 50 ohm characteristic impedance of the rf transmission line to the much lower impedance of the plasma reactor chamber. The plasma is generated by detuning the match network to make the powered electrode function as an igniter and then is tuned to reduce the self-bias voltage to a level appropriate for etching wafers without damage to the wafers.

In the case of plasma wafer cleaning, the frequency is chosen to produce a high current density at voltages that do not etch the wafer or implant ions into the wafer. In the case of plasma enhanced chemical vapor deposition, the bombardment voltage and current should be compatible with good deposition uniformity, high film purity and the appropriate level of film stress.

DESCRIPTION OF THE PREFERRED EMBODIMENT

Figure 1:
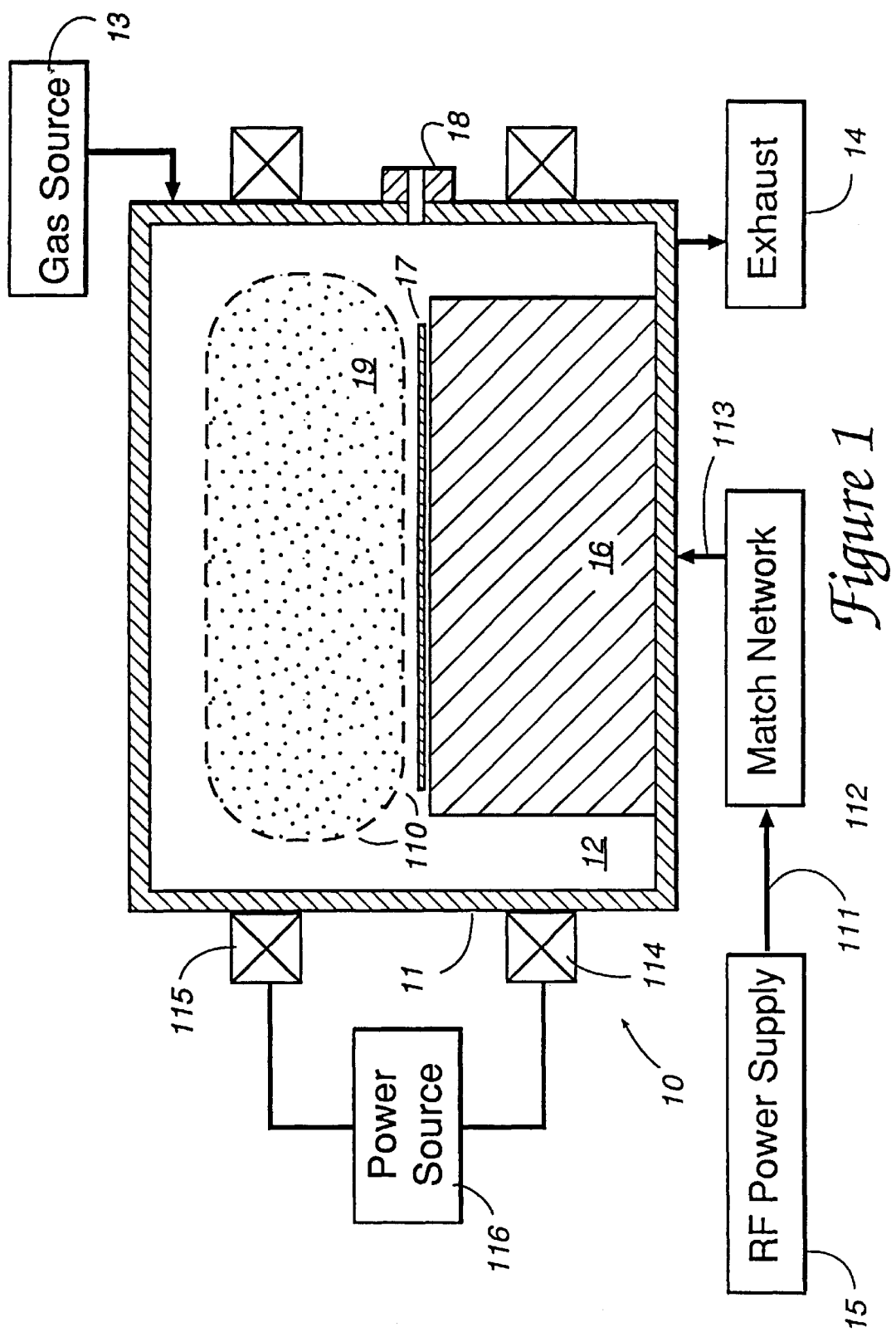
FIG. 1 illustrates the structure of a typical plasma reactor.

The fundamental nonreactive etch prior to metal 2 deposition typically is executed at an etch rate on the order of 250 Angstroms per minute (equivalent silicon dioxide etch rate) in order to complete this etch step within about 40 seconds. At this rate, this etch step duration plus system overhead to transfer wafers into and out of the reactor meets a system throughput requirement of 60 wafers per hour. Many IC circuit designs today contain layers that can be damaged by bombardment by high energy ions. To avoid such damage while retaining an etch time on the order of 40 seconds, the plasma is generated by an rf field of frequency higher than the 13.56 ISM (industry, scientific, medical) frequency that is conventionally utilized.

Because it is important to maintain system throughput, as the frequency was varied in these tests, the power was adjusted to achieve a 250 Angstroms per minute equivalent silicon dioxide etch rate For such etch rate, the negative self bias voltage was measured to be just over 500 volts for a 40 MHz frequency and was measured to be approximately 310 volts for a 60 MHz frequency. This confirms that soft etches (i.e., etches with self bias on the order of or less than 500 volts) with acceptable throughput can be produced at these frequencies. The self-bias voltage for comparable powers at 137 MHz is −125 volts. Therefore, it appears that a useful range of frequencies for achieving a soft etch that etches the wafer without damaging thin layers extends from 30 MHz to 200 MFz. Frequencies above 137 MHz are particularly useful for wafer cleaning and plasma enhanced chemical vapor deposition. The preferred choice of frequency is in the range 50–70 MHz because this produces the required etch rate under conditions (self-bias near −300 V). For a frequency f in the range 13.56 MHz<f<200 MHz and an rf power that produces a 250 Angstroms per minute equivalent silicon dioxide etch rate, the etch uniformity is comparable to the uniformity exhibited by conventional 13.56 MHz nomnagnetized processes. For a nonreactive etch, the gas pressure-s selected in the range from 1 to 20 milliTorr.

A soft etch process that uses high frequency rf power is useful in both nonreactive, nonselective etch processes and in reactive ion etch processes. The power is generally higher and the pressure is generally lower for the nonreactive ion processes. For example, for an etch with argon ions, the power should be on the order of 300 Watts and the pressure should be on the order of 4 mTorr. A reactive ion etch normally employs fluorine-containing or chlorine-containing gases. For example, the reactive ion etch containing 10 mole percent $NF_3$ or 5 mole percent $BCl_3$, the power should be on the order of 10–50 Watts and the pressure should be on the order of 10–40 mTorr.

For a cleaning process, the pressure is typically selected in the range from 1 to 40 milliTorr and the self-bias voltage is selected in the range from 5 to 300 volts. Preferably, the pressure is on the order of 5 milliTorr and the self-bias voltage is on the order of 15 volts. To achieve these parameter values, the frequency should be selected in the range from 100 to 200 MHz. Particularly useful gases for wafer cleaning are pure argon, hydrogen and gas mixtures that include a fluorine-containing gas.

The frequency can also be selected to optimize various plasma enhanced chemical vapor deposition processes. For example, for that of silicon dioxide, the total process pressure can range from 0.5 to 20 milliTorr. The optimum pressure is on the order of 5 milliTorr. The self-bias voltage is typically in the range from 10 to 400 volts and is preferably selected to be on the order of 150 volts. To achieve these parameter values, the frequency should be selected in the range from 100 to 200 MH. Particularly usefull gases for plasma enhanced chemical vapor deposition are argon, silane and TEOS.

A pair of electromagnetic coils 114 and 115 and associated power supply 116 are included to produce a weak magnetic field that deflects plasma ions away from the walls of the plasma reactor. This is important to avoid contamination of the wafer during processing. Unlike in the prior art, it is not necessary that these fields be uniform at the surface of the wafer because they are too weak (on the order of 1–20 Gauss at the surface of the wafer) to significantly affect process uniformity. However, this range of magnetic field is sufficient to prevent plasma ions from impacting the walls with sufficient energy to desorb contaminants from those walls.

A match network is used to couple power from the 50 ohm impedance rf power line to the much lower impedance plasma without producing a significant amount of reflected power at the match network. For the frequencies significantly above 13.56 MHz (i.e., on the order of or greater than 40 MHz), the conventional match network design cannot be used.

At rf frequencies, the wavelength of the signals becomes small enough that phase variation of signals over the lengths of cables can produce significant interference effects. In this frequency range, cables should be substantially equal to an integral number of quarter wavelengths. In particular, cable 111 from rf power supply 15 to match network 112 and cable 113 from match network 112 to powered electrode 16 should each be substantially equal to an integral number of quarter wavelengths. By "substantially equal to" is meant that this length is equal to an integral number of quarter wavelengths plus or minus 0.05 quarter wavelength. This requirement is easily met at 13.56 MHz where a quarter wavelength is on the order of 15 feet, so a small cutting error of the length of such cable will not be significant. However, at 60 MHz, a quarter wavelength is about 3 feet so that cable length errors are proportionately 5 times as significant. The addition of a single extra connector or circuit element can violate this cable length criterion.

In addition, at these frequencies, the discrete components, such as interdigitated blade capacitors and multiple coil inductors, conventionally used in the match network for a 13.56 MHz plasma apparatus are unsuitable for use at the higher frequencies. The inductances of such discrete components are too large for frequencies on the order of or greater than 40 MHz. In the chosen range of frequencies, an inductor can be a single strip of conductor. Likewise, the multiblade interdigitated blade capacitors of 13.56 MH systems are replaced by a simple pair of parallel conductive plates spaced by a nonconductor such as a teflon sheet.

Figure 2:
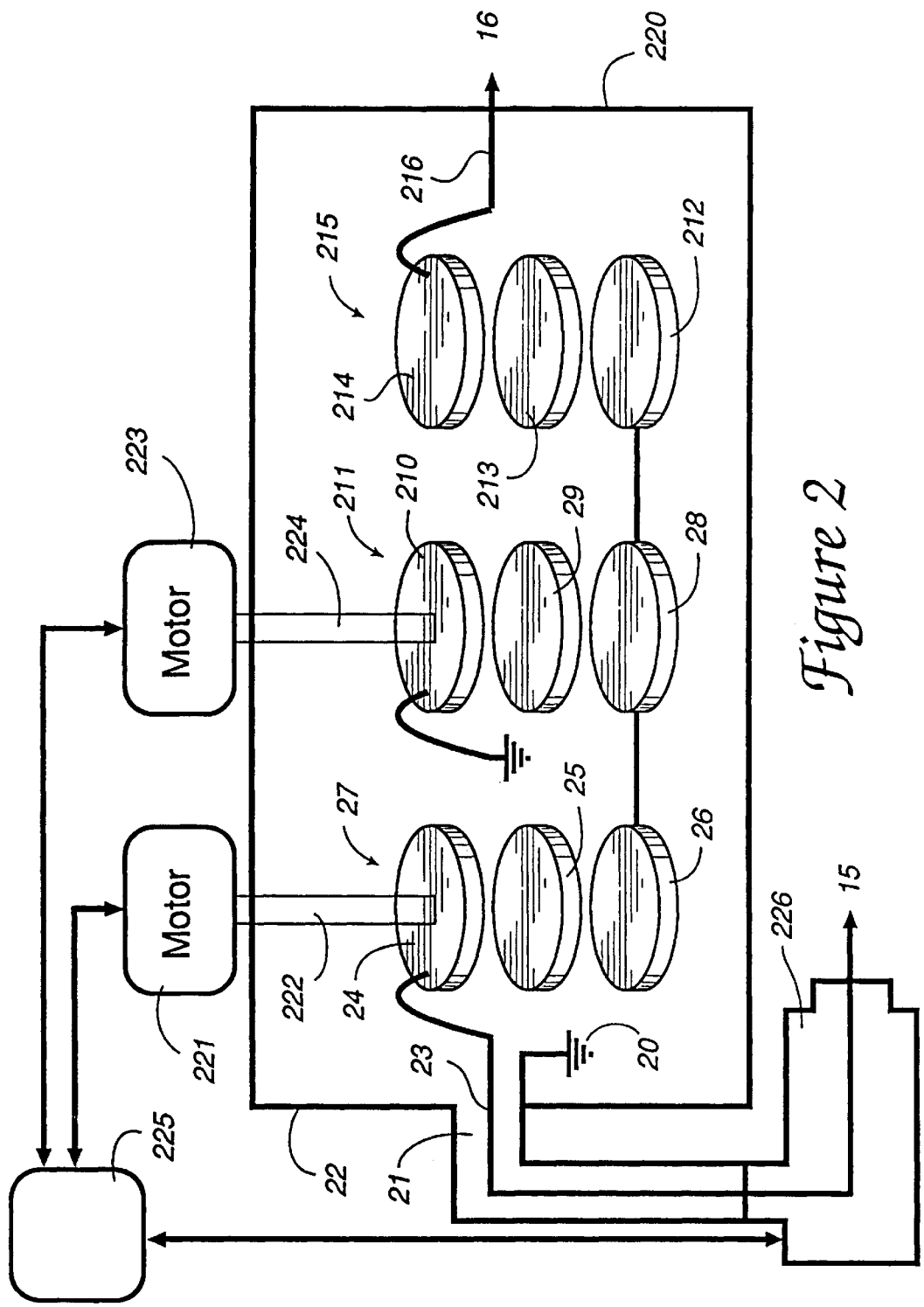
FIG. 2 illustrates a match network suitable for coupling rf power at frequencies significantly above 13.56 MHz to a plasma reactor.
Figure 3:
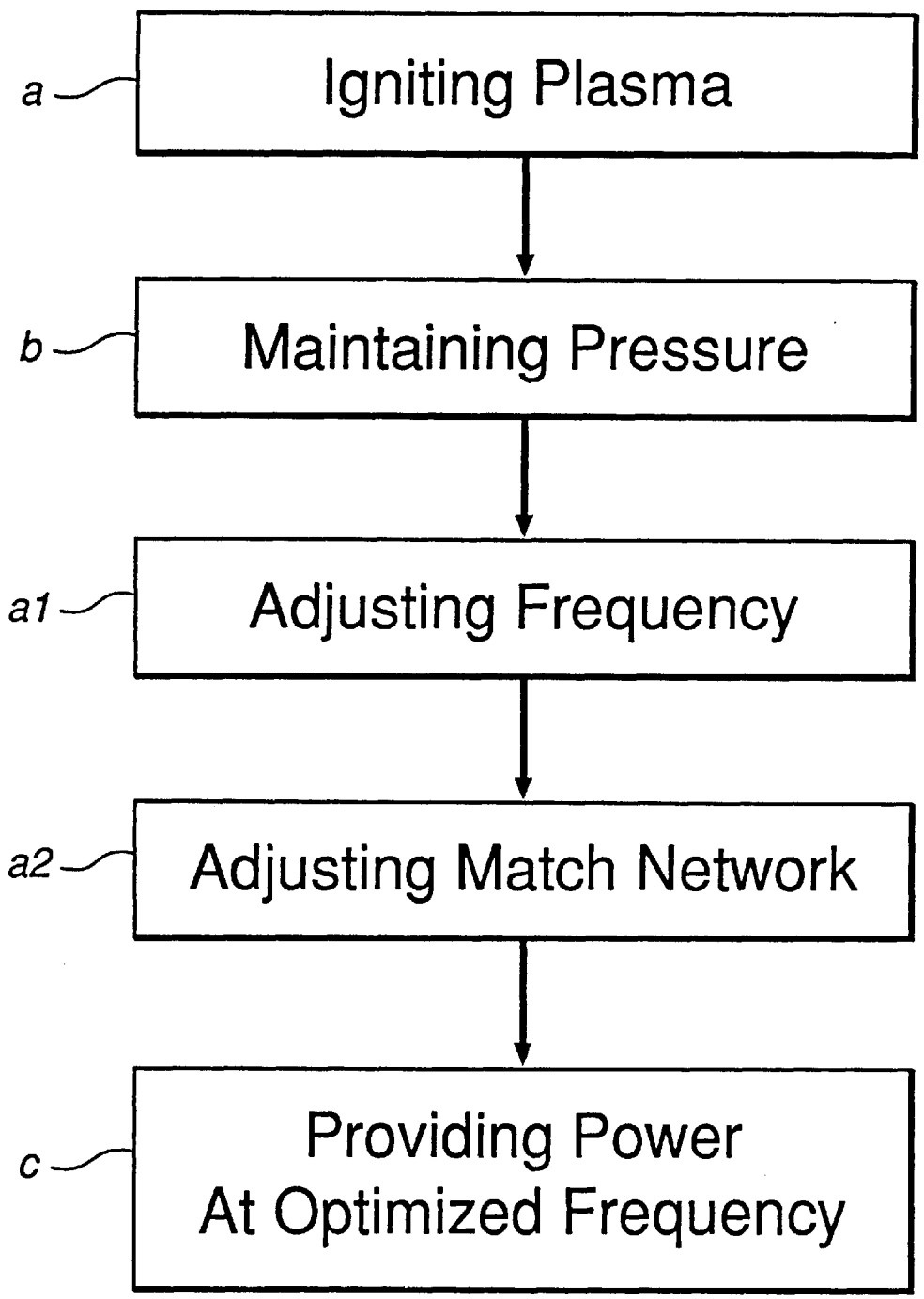
FIG. 3 is a flow diagram of a process utilizing the plasma reactor and match network of FIGS. 1 and 2, respectively.

FIG. 2 illustrates a match network design that can be used at frequencies above 40 MHz. A ground 20 is connected to the outer conductor of a first rf connector 21 located in a wall 22 of match network 112. A conductor 23 electrically connects the inner conductor of connector 21 to a first plate 24 of an input capacitor 27. This capacitor also contains a second plate 26 and a dielectric spacer 25. Plate 26 is electrically connected to a first plate 28 of a shunt capacitor 211 that also contains a dielectric spacer 29 and a second plate 210. Plate 28 is also connected to a first plate 212 of a third capacitor 215, that also includes a dielectric spacer 213 and a second plate 214. Plate 214 connects through an inductor 216 to rf electrode 16.

To permit tuning of this match network at a given frequency in the range 40–100 MHz, capacitors 27 and 211 are variable capacitors. In this embodiment, these capacitances are varied by variation of the spacing between plates 24 and 26 and between the spacing between plates 28 and 210. Variation of these spacings is achieved by means of a motor 221 connected by a rotary-to-linear-displacement coupling 222 and a motor 223 connected by a rotary-to-linear-displacement coupling 224. An automated control circuit 225 automatically adjusts these two capacitances to minimize the amount of power reflected at rf coupler 21. To enable such adjustment, a detector 226, connected between rf power supply 15 and rf connector 21 provides to control circuit 225 information about the relative phase between the current and voltage components of the rf power input; and the ratio of the magnitudes of the current and voltage components of the rf power input signal. Control circuit 225 is a conventional feedback control circuit that adjusts the plate spacings of capacitors 27 and 211 until the relative phase and ratio of magnitudes of the rf current and voltage signals reaches preset values that are selected to produce substantially zero reflection of power back toward the rf power source. Typically, for a tuned match network, this system will produce less than 10 Watts of reflected power from a 300 Watt input signal.

For operation over the range of rf frequencies from 40–100 MHz, components 27, 211, 215 and 216 should have the values 10–100 pf, 50–400 pf, 100 pf and 0.5 $\mu$H, respectively.

The variable control of the capacitors enables electrode 16 to function as an igniter electrode to generate a plasma as well as the powered electrode to maintain the plasma. When it is utilized as the igniter electrode, the feedback control of capacitors 27 and 211 is inactivated and these capacitances are set respectively to 100 pf and 400 pf. This produces at electrode 16 an electric field strength which is sufficiently large to produce a cascade of electrons that ignites the plasma. After ignition and tuning, the self-bias voltage on the powered electrode is on the order of −300 volts for 300 Watts of power at 60 MHz.

Because this plasma apparatus can be operated over a range of frequencies, the chosen frequency will not in general be one of the ISM (industrial, scientific, medical) frequencies. Therefore, rf gasketing is used in all vacuum flanges of reactor 10, no windows into chamber 12 are allowed, and all elongated openings in the chamber are eliminated or shielded so that rf radiation from reactor 10 is eliminated to an extent that reduces rf emissions below the United States governmentally allowed level of 15 $\mu$V/m at a distance of 300 m from the apparatus. This avoids interference with TV and other rf communication near such reactors. Although tests have indicated that a faster etch without significant damage to the wafer is achieved at 60 MHz than at 40 MHz, the frequency of 40.68 MHz is an attractive choice because it is an ISM standard frequency with reduced radiation limits. Harmonics of this frequency are still a problem, but the power in these harmonics is generally substantially less than at the fundamental.

We claim:

1. A plasma process apparatus comprising:

a plasma reactor having a powered electrode on which a wafer is to be placed for processing;

a single rf power supply that produces power at a single rf frequency f in the range greater than 13.56 MHz and up to 200 MHz connected to said powered electrode, said frequency f selected so as to optimize a wafer process to be carried out in said reactor.

2. A plasma process apparatus as in claim 1 further comprising a tunable matching network connecting said rf power supply to the powered electrode, said matching network being detuned so as to allow a plasma to be ignited in said reactor and means to tune said match network so as to substantially eliminate reflected power after ignition of said plasma.

3. A plasma process apparatus as in claim 1 wherein the power supply is tunable over a frequency range, thereby enabling adjustment of frequency to optimize plasma process conditions for a variety of process characteristics and to produce a negative self-bias at the powered electrode of 350 volts or less.

4. A plasma process apparatus as in claim 2 wherein said reactor is rf shielded so as to reduce rf emissions from said apparatus to 15 mV/m or less at 300 m from the apparatus.

5. A plasma process apparatus as in claim 2 wherein the frequency is in the range from 50 MHz up to 70 MHz, whereby this apparatus is used for a plasma etch process.

6. A plasma process apparatus as in claim 2 wherein the frequency is in the range from 137 MHz up to 200 MHz whereby this apparatus is used for wafer cleaning and plasma enhanced chemical vapor deposition processes.

7. A plasma process apparatus as in claim 1 further comprising means for producing within said process apparatus a magnetic field parallel to the wall that reduces desorption from interior walls of said plasma process apparatus.

8. A plasma process apparatus as in claim 7 wherein said magnetic field, at said interior walls, is in the range 1–20 Gauss.

9. A plasma process apparatus as in claim 2 further comprising:

(a) means for maintaining a plasma within the chamber; and (b) means for selectively controlling the power at a predetermined power level at a single frequency f greater than 13.56 MHz and up to 200 MHz wherein the power is being supplied from a single power supply and the frequency f is selected to produce a power electrode negative self-bias in the range of at least 125 up to 500 volts, for a non-reactive, non-selective inert gas ion, soft plasma etch.

10. A plasma process apparatus as in claim 9 wherein the frequency f is in the range 50 MHz up to 70 MHz.

11. A plasma process apparatus as in claim 9 wherein:
(a) said tunable match network includes means for detuning the match network to produce a self-bias field at the powered electrode so that a cascade of electrons is produced that ignites said plasma; and
(b) means for tuning the match network after the plasma has been ignited to reduce reflected power.

* * * * *